United States Patent [19]
Gardner

[11] Patent Number: 6,025,238
[45] Date of Patent: Feb. 15, 2000

[54] SEMICONDUCTOR DEVICE HAVING AN NITROGEN-RICH PUNCHTHROUGH REGION AND FABRICATION THEREOF

[75] Inventor: Mark I. Gardner, Cedar Creek, Tex.

[73] Assignee: Advanced Micro Devices, Austin, Tex.

[21] Appl. No.: 08/993,223

[22] Filed: Dec. 18, 1997

[51] Int. Cl.[7] .................................................. H01L 21/336
[52] U.S. Cl. ............................................. 438/301; 438/528
[58] Field of Search .................................. 438/301, 297, 438/305, 919

[56] References Cited

U.S. PATENT DOCUMENTS

| | | | |
|---|---|---|---|
| 4,728,619 | 3/1988 | Pfiester et al. | 437/34 |
| 4,963,502 | 10/1990 | Teng et al. | 437/41 |
| 5,393,693 | 2/1995 | Ko et al. | 437/69 |
| 5,418,375 | 5/1995 | Hoskins et al. | |
| 5,514,902 | 5/1996 | Kawasaki et al. | |
| 5,650,340 | 7/1997 | Burr et al. | 437/30 |
| 5,654,210 | 8/1997 | Aronowitz et al. | 438/526 |
| 5,661,046 | 8/1997 | Ilderem et al. | 438/202 |
| 5,674,760 | 10/1997 | Hong | 437/24 |
| 5,792,680 | 8/1998 | Sung et al. | 438/210 |

*Primary Examiner*—Richard Booth
*Assistant Examiner*—Walter L. Lindsay, Jr.
*Attorney, Agent, or Firm*—Merchant & Gould P.C.

[57] ABSTRACT

A semiconductor device having an nitrogen-rich punchthrough region under the channel region, and a process for fabricating such a device are disclosed. In accordance with one embodiment, a semiconductor device is formed by forming an nitrogen-rich punchthrough region in a substrate, and forming a channel region over the nitrogen-rich punchthrough region. The use of an nitrogen-rich punchthrough region may, for example, inhibit the diffusion of dopants used in forming the channel region.

14 Claims, 2 Drawing Sheets

SEMICONDUCTOR DEVICE HAVING AN NITROGEN-RICH PUNCHTHROUGH REGION AND FABRICATION THEREOF

FIELD OF THE INVENTION

The present invention is directed generally to semiconductor devices and, more particularly, to a semiconductor device having an nitrogen-rich punchthrough region and a process for fabricating such a device.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. A punchthrough region 111 is typically formed beneath the channel region 107. The punchthrough region 111 is typically moderately doped with a dopant of a type opposite to that of the source/drain regions 105.

The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by implanting a first dopant into active regions adjacent the gate electrode 103 at relatively low concentration levels to form the lightly-doped regions 106; forming spacers 102 on sidewalls of the gate electrode 103; and implanting a second dopant into the active regions at higher concentration levels to form the heavily-doped regions 104. The substrate is typically annealed to drive the dopant in the heavily-doped regions deeper into the substrate 101.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET). Semiconductor devices, like the one described above, are used in large numbers to construct most modern electronic devices.

The punchthrough region 111 plays an important role in the operation of a semiconductor device by reducing unwanted current flow between the source and the substrate 101, typically when the gate voltage is below the threshold voltage. The punchthrough region 111 is typically formed by implanting a dopant of the opposite conductivity type as that of the source/drain region 105. The punchthrough implant is typically performed before forming the gate insulating layer 109, and is typically implanted to a depth ranging from about 300 to 1,500 Å.

SUMMARY OF THE INVENTION

Generally, the present invention relates to a semiconductor device having an nitrogen-rich punchthrough region under the channel region, and a process for fabricating such a device. The use of an nitrogen-rich punchthrough region may, for example, inhibit the diffusion of dopants used in forming the channel region.

In accordance with one embodiment of the invention, a semiconductor device is formed by forming an nitrogen-rich punchthrough region in a substrate, and forming a channel region over the nitrogen-rich punchthrough region.

The above summary of the present invention is not intended to describe every incrementation of the present invention. The figures and the detailed description which follow exemplify the embodiments more particularly.

BRIEF DESCRIPTION OF THE DRAWINGS

The invention may be more completely understood in consideration of the detailed description of the preferred embodiment of the invention in connection with the accompanying drawings, in which.

Figure 1:
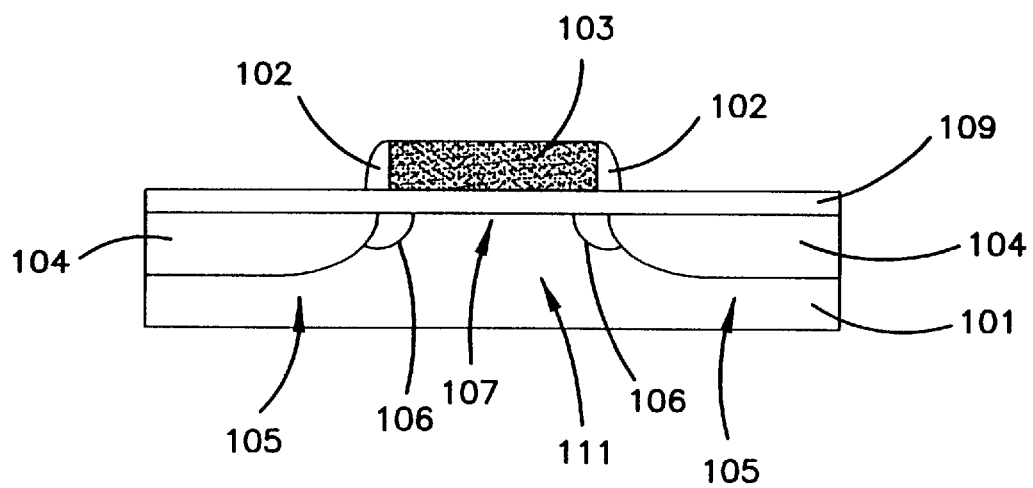
FIG. 1 is a typical MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS, CMOS, and BiCMOS structures. While the present invention is not so limited, an appreciation of various aspects of the invention will be gained through a discussion of the fabrication process and characteristics of such a device in connection with the examples provided below.

Figure 2A:
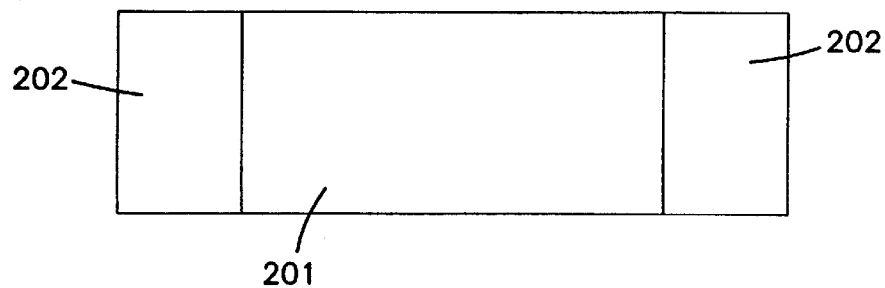
FIGS. 2A–2D illustrate an exemplary process in accordance with one embodiment of the invention.

FIGS. 2A–2D illustrate an exemplary process for fabricating a semiconductor device with an nitrogen-rich punchthrough region under a channel region. In accordance with this exemplary process, isolation regions 202 may be formed in a substrate 201, as illustrated in FIG. 2A. The isolation regions 202 may be formed using, for example, well-known LOCOS or trench isolation techniques. The isolation regions 202 are used to separate active areas (only one of which is shown) in which active devices, such as transistors, are formed. After forming the isolation regions, a well implant may be performed to form well regions in the substrate 201. The well implants are typically performed using a dopant of a conductivity type opposite to that of the substrate. The well implant may be performed using, for example, well-known techniques. The well regions are typically used to enable the fabrication of, for example, both PMOS and NMOS devices on the same substrate. Typically, the devices of one type are formed in the well regions and the devices of another type are formed outside of the well regions.

Figure 2B:
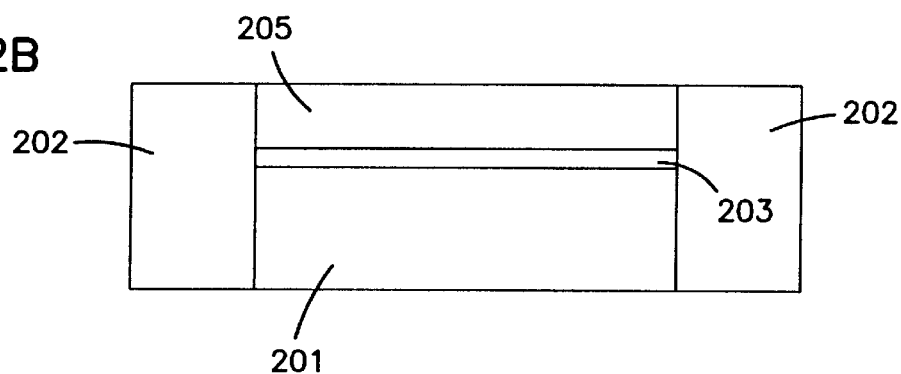

An nitrogen-rich punchthrough region 203 is formed in the substrate 201, as shown in FIG. 2B. The nitrogen-rich punchthrough region 203 may be formed, for example, by implanting a nitrogen-bearing species in the substrate 201. Suitable nitrogen-bearing species include $N_2$ and $N_{14}$, for example. A channel region will be formed over the nitrogen-rich punchthrough region 203. The nitrogen-rich punchthrough region 203 will be used to inhibit diffusion of dopants used to form the channel region and serve to confine the channel dopants between the nitrogen-rich punchthrough region 203 and the substrate surface.

The implant energy is chosen depending on the nitrogen-bearing species and on the desired depth of the nitrogen-rich punchthrough region 203. Suitable depths of the nitrogen-rich punchthrough region 203 range from about 300 to 1,500 Å for many applications. Suitable implant energies depend on the nitrogen species being implanted and typically range from about 50 to 250 keV for many applications using an $N_2$ implant. The concentration of the implanted nitrogen-bearing species is chosen depending on the desired concentration of the nitrogen-rich punchthrough region 203. Suitable concentrations range from about 1E13 to 5E15 atoms/$cm^2$ (i.e. $1 \times 10^{13}$ to $5 \times 10^{15}$ atoms/$cm^2$) for many applications.

A lightly-doped region 205 is formed over the nitrogen-rich punchthrough region 203, as shown in FIG. 2B. Portions of the lightly-doped region 205 will be used to form a channel region over the nitrogen-rich punchthrough region 203. The lightly-doped region 205 is typically formed by implanting a dopant of the opposite conductivity type than that of the active region dopant. The lightly-doped region 205 and the associated implant are commonly referred to as a threshold voltage region and a threshold voltage implant respectively.

Figure 2C:
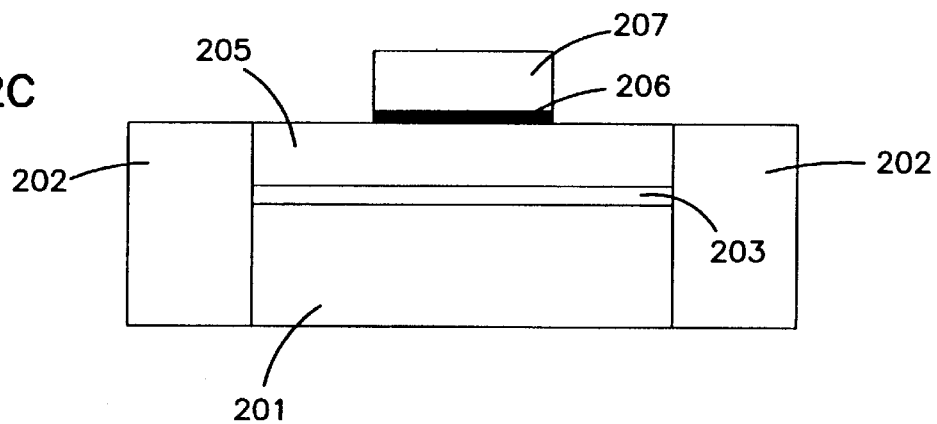

A gate electrode 207 is formed over the substrate 201 after forming the nitrogen-rich punchthrough region 203 and the lightly-doped region 205, as illustrated in FIG. 2C. The gate electrode 207 is typically separated from the substrate 201 by a gate insulating layer 206, such as an oxide layer, for example. It should be appreciated that the gate electrode structure depicted in FIG. 2C may be formed using a number of different known techniques.

Figure 2D:
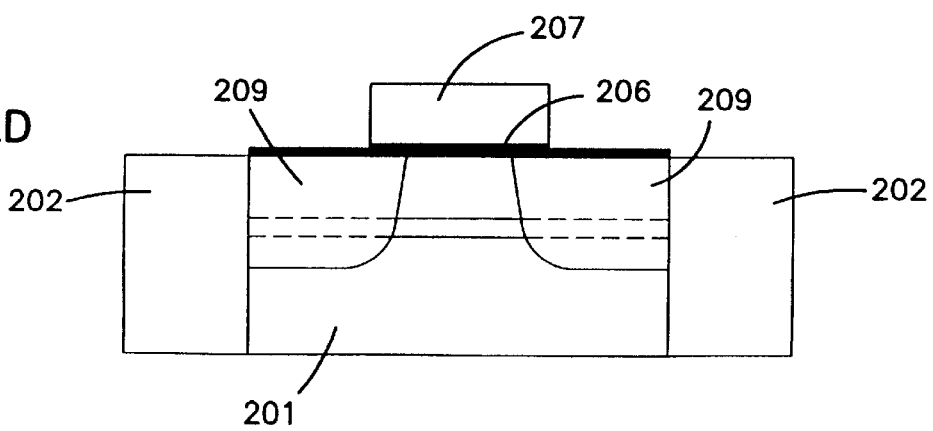

Active regions 209 may are formed in the substrate 201, adjacent the gate electrode 207, as illustrated in FIG. 2D. The active regions 209 may, for example, be LDD (lightly-doped-drain) source/drain regions. An LDD source/drain region may be formed by making two implants in the substrate 201. Typically, the first implant is a low dose, low energy implant of a dopant (of a conductivity type opposite that of the channel region), and the second implant is a heavy dose, higher energy implant of a similar-type or the same dopant. The first dose is typically implanted into the substrate 201 when the semiconductor device has the configuration shown in FIG. 2C. Before the second dose is implanted, spacers (not shown) are formed on sidewalls of the gate electrode 207. The spacers are used to space the second dopant implant from the gate electrode 207 and the channel region below the gate electrode 207. The dopant implants, as well as spacer formation, may be done using well-known techniques.

The conductivity type of the dopant(s) used to form the active regions 209 depends on the type (e.g. NMOS or PMOS) of device being formed. For example, in an NMOS transistor the source/drain regions are formed by implanting an n-type dopant, such as arsenic or phosphorus. Correspondingly, in an PMOS transistor the source/drain regions are formed by implanting a p-type dopant, such as boron. The nitrogen-rich region 203 will typically inhibit diffusion of the active region dopants (e.g., during the implant as well as the source/drain anneal). Depending on the depth of the active region implants as well as the relative dosages of the active region and nitrogen implants, the depth of the active regions 209 can vary. For example, the active regions 209 may be substantially confined above the nitrogen-rich region 203 or may extend within or beneath the nitrogen-rich regions 203.

After forming the active regions 209, the substrate 201 is typically heated to activate the dopants in the active regions 209 and to drive the dopants deeper into the substrate 201. The substrate 201 may be heated using, e.g., well-known anneal techniques such as rapid thermal anneal (RTA). During this heating, the dopants in the active regions 209 as well as the channel dopants tend to diffuse further into the substrate 201. The nitrogen-rich punchthrough region 203 will, however, advantageously act to inhibit diffusion of the channel region dopants.

Using the above process, a semiconductor device can be fabricated having an nitrogen-rich punchthrough region. The use of an nitrogen-rich punchthrough region can, for example, inhibit the diffusion of channel dopants. This can, for example, increase the drive current of the transistor. The nitrogen-rich punchthrough region may also, for example, inhibit the flow of leakage currents from the channel region.

The present invention is applicable to the fabrication of a number of different semiconductor devices in which a nitrogen-rich punchthrough region and/or the benefits associated therewith are desired. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device comprising:
   forming a nitrogen-rich punchthrough region in a substrate; and
   forming a channel region over the nitrogen-rich punchthrough region.

2. The process of claim 1, wherein forming the nitrogen-rich punchthrough region includes implanting a nitrogen bearing species into the substrate.

3. The process of claim 2, wherein the nitrogen bearing species is $N_2$.

4. The process of claim 3, wherein $N_2$ is implanted with an energy between about 20 and 300 keV.

5. The process of claim 2, wherein the nitrogen bearing species is implanted at a concentration between about 1E13 and 5E15 atoms/cm$^2$.

6. The process of claim 1, wherein the nitrogen-rich punchthrough region is formed at a depth between about 250 and 450 Å.

7. The process of claim 1, wherein forming the channel region includes implanting channel dopant into the substrate.

8. The process of claim 1, further including forming a well implant in the substrate prior to forming the nitrogen-rich punchthrough region.

9. The process of claim 1, further including forming a gate electrode over the substrate, the gate electrode substantially defining the channel region.

10. The process of claim 1, further including forming active regions in the substrate adjacent the gate electrode.

11. The process of claim 10, wherein the active regions are source/drain regions.

12. The process of claim 11, wherein the source/drain regions are LDD source/drain regions.

13. The process of claim 1, further comprising forming isolation regions in the substrate prior to forming the nitrogen-rich punchthrough region.

14. The process of claim 13, wherein the nitrogen-rich punchthrough region extends between the isolation regions.

* * * * *

UNITED STATES PATENT AND TRADEMARK OFFICE
CERTIFICATE OF CORRECTION

PATENT NO. : 6,025,238
DATED : Feb. 15, 2000
INVENTOR(S) : GARDNER

It is certified that error appears in the above-identified patent and that said Letters Patent is hereby corrected as shown below:

Col. 3, line 61: "are" should read --be--.

Signed and Sealed this

Twenty-seventh Day of March, 2001

Attest:

NICHOLAS P. GODICI

Attesting Officer

Acting Director of the United States Patent and Trademark Office